United States Patent [19]

Dalvie et al.

[11] Patent Number: 5,505,780
[45] Date of Patent: Apr. 9, 1996

[54] HIGH-DENSITY PLASMA-PROCESSING TOOL WITH TOROIDAL MAGNETIC FIELD

[75] Inventors: Manoj Dalvie, Katonah; Satoshi Hamaguchi, White Plains, both of N.Y.

[73] Assignee: International Business Machines Corporation, Armonk, N.Y.

[21] Appl. No.: 853,363

[22] Filed: Mar. 18, 1992

[51] Int. Cl.⁶ .................................................. C23C 16/54
[52] U.S. Cl. ................................. 118/723 MA; 156/345; 118/723 I
[58] Field of Search .................... 118/723 MR, 723 MA, 118/723 I; 376/138; 156/345

[56] References Cited

U.S. PATENT DOCUMENTS

| | | | |
|---|---|---|---|
| H268 | 5/1987 | Owen | 376/138 |
| 3,278,384 | 10/1966 | Lenard et al. | |
| 3,433,705 | 3/1969 | Cornish | 376/133 X |
| 4,110,595 | 8/1978 | Brambilla et al. | 376/133 X |
| 4,292,125 | 9/1981 | Bers | 376/133 X |
| 4,368,092 | 1/1983 | Steinberg et al. | 156/345 |
| 4,732,761 | 3/1988 | Machida et al. | 437/228 |
| 4,735,765 | 4/1988 | Harris et al. | 376/133 X |
| 4,767,590 | 8/1988 | Stix et al. | 376/133 |
| 4,794,217 | 12/1988 | Quan et al. | 437/247 |
| 4,861,622 | 8/1989 | Yamazaki et al. | 427/54.1 |
| 4,877,757 | 10/1989 | York et al. | 437/235 |
| 4,918,031 | 4/1990 | Flamm et al. | 437/225 |
| 4,985,113 | 1/1991 | Fujimoto et al. | 156/345 X |

FOREIGN PATENT DOCUMENTS

61-1024  1/1986  Japan.

*Primary Examiner*—R. Bruce Breneman
*Assistant Examiner*—Jonathan Baskin
*Attorney, Agent, or Firm*—Sterne, Kessler, Goldstein & Fox; Stephen C. Kaufman

[57] ABSTRACT

A high-density plasma-processing reactor with a processing chamber configuration which closes upon itself. The reactor applies a toroidal magnetic field to the plasma discharge which creates magnetic field lines which close upon themselves thereby preventing the magnetized plasma electrons traveling along these magnetic field lines from diffusing to the chamber wall or adjacent magnetic field lines. This electron confinement scheme is expected to result in a plasma density in the $10^{12}$ to $10^{13}$ cm$^{-3}$ range. The high density plasma processing reactor includes a plasma processing chamber which forms an enclosed configuration mounted within a plurality of toroidal solenoid coils and containing a plurality of plasma source regions.

20 Claims, 10 Drawing Sheets

Fig. 1

PRIOR ART

Fig. 2

PRIOR ART

HIGH-DENSITY PLASMA-PROCESSING TOOL WITH TOROIDAL MAGNETIC FIELD

DESCRIPTION

1. Technical Field

This invention relates generally to plasma processing reactors. More specifically, this invention relates to semiconductor device fabrication.

2. Background Art

Plasma discharges are extensively utilized in the fabrication of microelectronic devices. In these applications, the plasma discharge is formed from a chosen gas which is placed in a plasma processing chamber for processing. In this chamber the gas is dissociated into positive and negative ions and radicals. The resulting plasma discharge is then utilized to fabricate the microelectronic devices.

Two methods employing plasmas commonly used in the fabrication of microelectronic devices are anisotropic etching and plasma-enhanced chemical vapor deposition (PECVD). In anisotropic etching, the plasma discharge is utilized in etching a pattern into a substrate material. The reactive species is placed in contact with the unprotected areas of the material disposed on the substrate to remove elected portions of the material from the substrate. In PECVD, plasma discharges in appropriate precursor gases are utilized to induce formation of a solid on a deposition substrate.

As the trend toward larger wafers and single-wafer-processing in microelectronics fabrication continues, more stringent demands are being placed on process throughput. In particular, etching processes are required to produce higher etch rates without sacrificing anisotropy. Since anisotropic etch rates are a function of the density of the plasma used, these demands have spurred research in the area of high density plasma processing. Generally, the research has centered around magnetic confinement schemes.

Various sourcing techniques have been employed in high-density plasma processing chambers for producing the desired plasma discharge. One sourcing technique which is commonly used in high-density plasma processing chambers is radio frequency induction (RFI). Here, an inductively-coupled plasma source is produced by oscillating fields generated by RF coils wound around the chamber. U.S. Pat. No. 4,368,092 to Steinburg, et al, illustrates this technique implemented as a helical coil wrapped around a straight plasma processing chamber. Another sourcing technique is electron cyclotron resonance (ECR) used in the magnetic guide chamber shown in FIG. 1. This technique includes a source for procuding microwaves which are used to generate plasmas in the resonant regions of the magnetic field. ECR is commonly used and known in the art. See Suzuki, et al. *Journal of the Electromechanical Society* 126, 1024 (1979) for examples of ECR implementations.

Plasma reactors, utilizing different confinement schemes, process the plasma discharge generated from these various sourcing methods to form plasmas with the preferred characteristics. Two types of plasma confinement schemes which are commonly used in the art are the magnetic guide field chamber and the magnetic multipole chamber.

Figure 1:
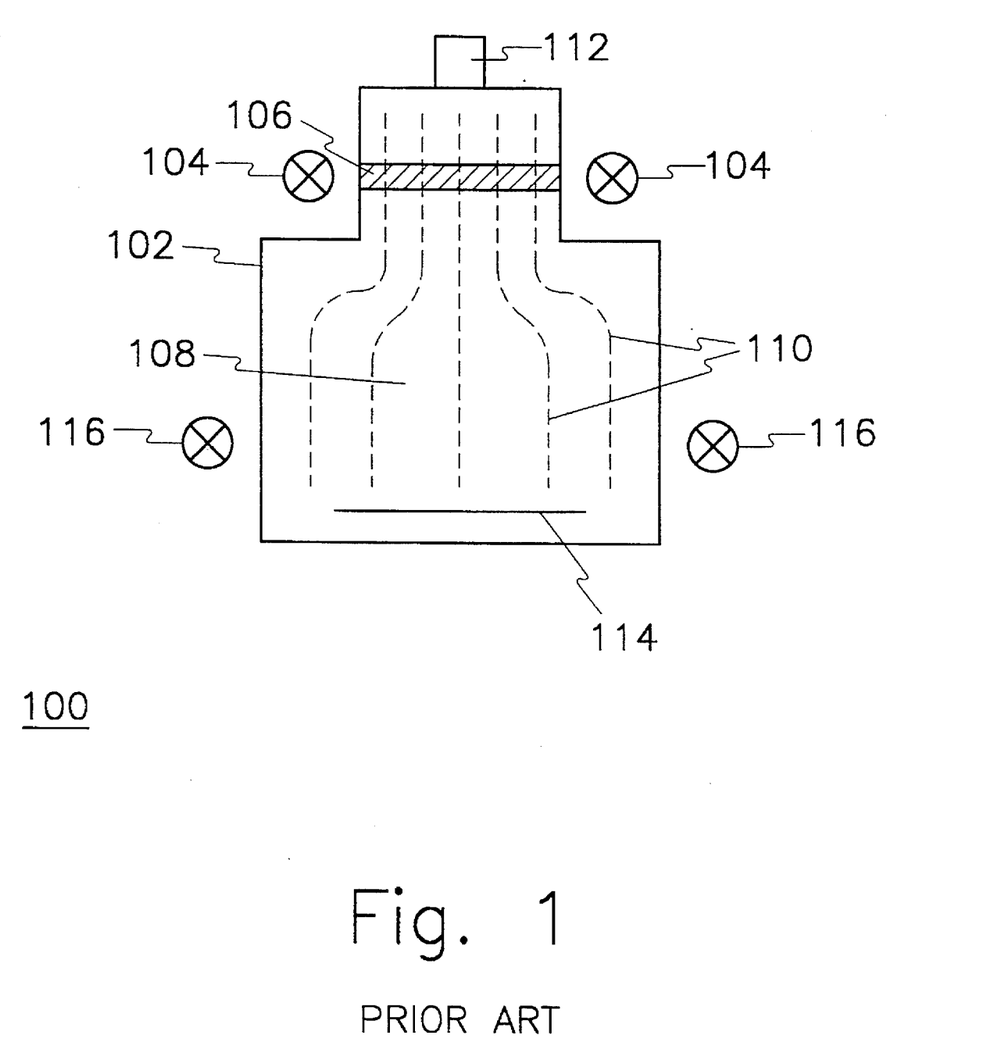
FIG. 1 is a side-view perspective of a magnetic guide field etching device.

FIG. 1 is an illustration of a magnetic guide field plasma tool 100. Plasma chamber 102 contains plasma source 106 in the upper portion of the chamber. A microwave device 112 is used to excite the plasma. Plasmas are generated in the resonasnt regions of ECR source solenoid 104, producing plasma discharge 108. This configuration prevents the divergence of plasma discharge 108 in the magnetic guide field processing chamber 102 by guiding plasma discharge 108 along magnetic field lines 110 directly into substrate 114. Magnetic field lines 110 are produced by guide field solenoid 116. The magnetic guide field processing tool achieves the goal of increasing the density of plasma discharge 108 that comes in contact with substrate 114. However, it does not control the rate at which the plasma electron diffuse axially. Rather, it compensates for these losses by concentrating the remaning plasma discharge 108 utiliing magnetic field lines 110. Also, the plasma density is not the same along each magnetic field line and is therefore not uniform across the substrate. This can produce non-uniformities over the substrate.

Figure 2:
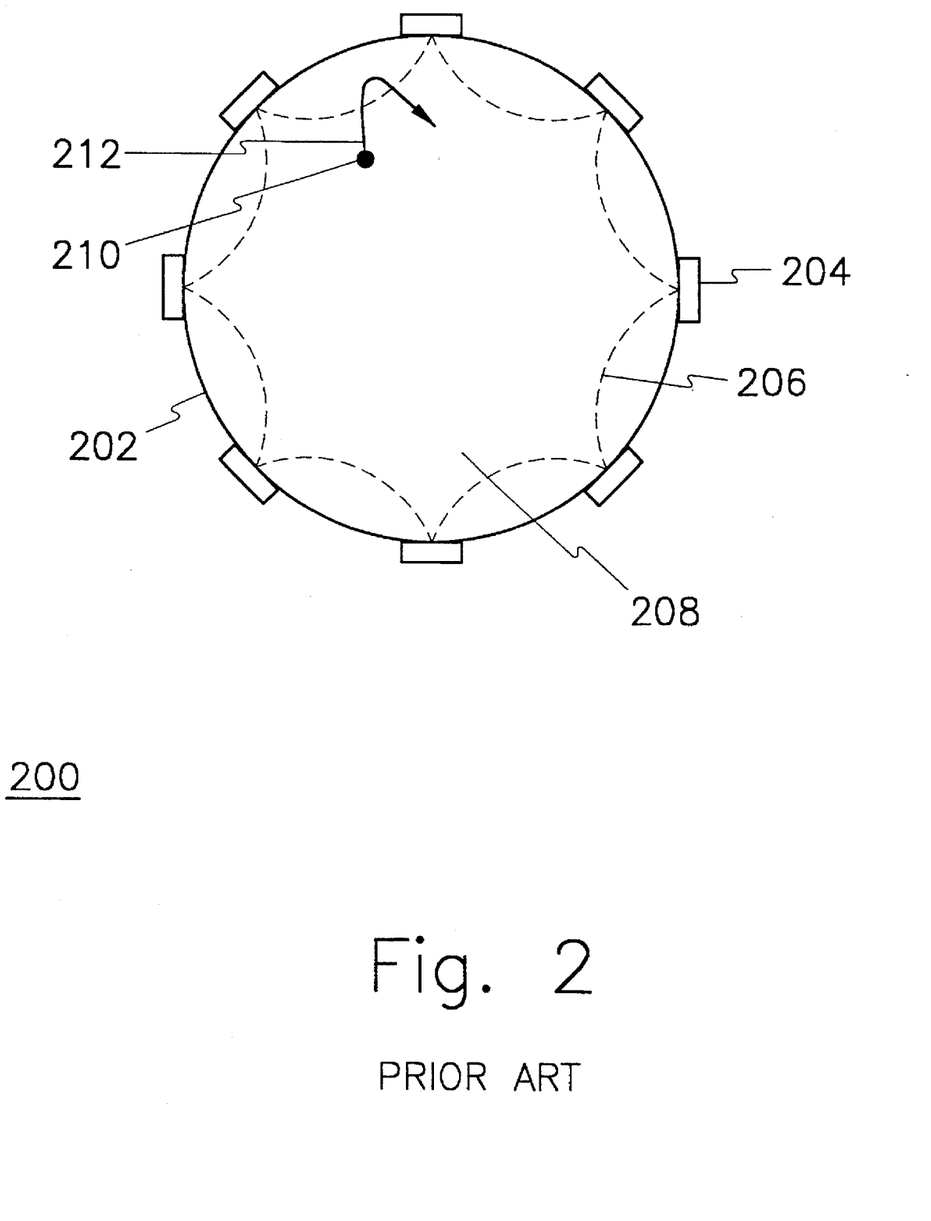
FIG. 2 is A top-view perspective of a magnetic multipole etching device.

FIG. 2 is a top-view perspective of a magnetic multipole plasma chamber 200 containing plasma 208. In this configuration, permanent magnets 204 form magnetic field lines 206 around chamber 202. When plasma discharge electrons 210 approach the wall of chamber 202, they experience a Lorentz acceleration which reflects them back towards and into the plasma, following electron path 212. This confinement scheme is more commonly used today than the magnetic guide field technique illustrated in FIG. 1. However, high electron diffusion occurs at the cusps of the magnetic field lines 206 near the magnets 204, thereby reducing the plasma density.

What is needed is a plasma processing reactor which will produce a high density, uniform plasma which is capable of achieving high anisotropic etch rates.

DISCLOSURE OF INVENTION

The present invention comprises a high-density plasma-processing tool having a plasma processing chamber with an interior flow path defined by the magnetic field lines and the chamber walls. The processing chamber has a configuration which closes upon itself. The plasma processing tool further comprises a means for producing a toroidal magnetic field in the processing chamber, a pump means connected to the processing chamber for maintaining a vacuum in the chamber, and a means for producing a plasma discharge source contained within the plasma processing chamber.

The plasma source region canbe any source region known in the art, including radio requency induction (RFI) and electron cyclotron resonance (ECR). There may be a plurality of these cource regions within the processing chamber.

The means for producing a toroidal magnetic field comprises a plurality of solenoid coils mounted around the processing chamber. The toroidal magnetic field is comprised of magnetic field lines which are confined to the interior flow path of the processing chamber.

The high-density plasma-processing reactor is adapted to contain microelectronic devices, such as semiconductor wafers, parallel to the interior flow path of the plasma. The plasma discharge may induce anisotropic removal of material or induce deposition on the substrate.

The plasma processing tool further comprises a bias electrical power source means for applying an R. F. or DC bias voltage to the microelectronic device such that the plasma ions have sufficient energy for etching the microelectronic devices.

The high-density plasma-processing tool has a cross-sectional shape such that microelectronic device position, plasma stability, and plasma uniformity are maximized. The plasma processing chamber comprises a shape such that diffusion of electrons from said plasma to the walls is minimized.

FEATURES AND ADVANTAGES

It is a feature of the present invention that the high density plasma electrons are confined to magnetic field lines which close upon themselves thereby reducing electron loss by cross-field diffusion and other loss mechanisms. This results in electron life-times considerably longer than those found in traditional confinement schemes, thereby increasing the density of the plasma.

It is an additional feature of the present invention that a greater control may be exhibited over the ion bombardment of the microelectronic devices with ion biasing methods known in the art due to the higher plasma density.

It is an additional feature of the present invention that confining the plasma to an azimuthal magnetic field promotes plasma uniformities in the azimuthal (toroidal) direction. This in turn, enhances cross-wafer uniformity.

The foregoing and other objects, features and advantages of the invention will be apparent from the following more particular description of the preferred embodiments of the invention, as illustrated in the accompanying drawing(s).

BEST MODE FOR CARRYING OUT THE INVENTION

The preferred embodiment is now described with reference to the figures where like reference numbers indicate like elements.

Figure 3A:
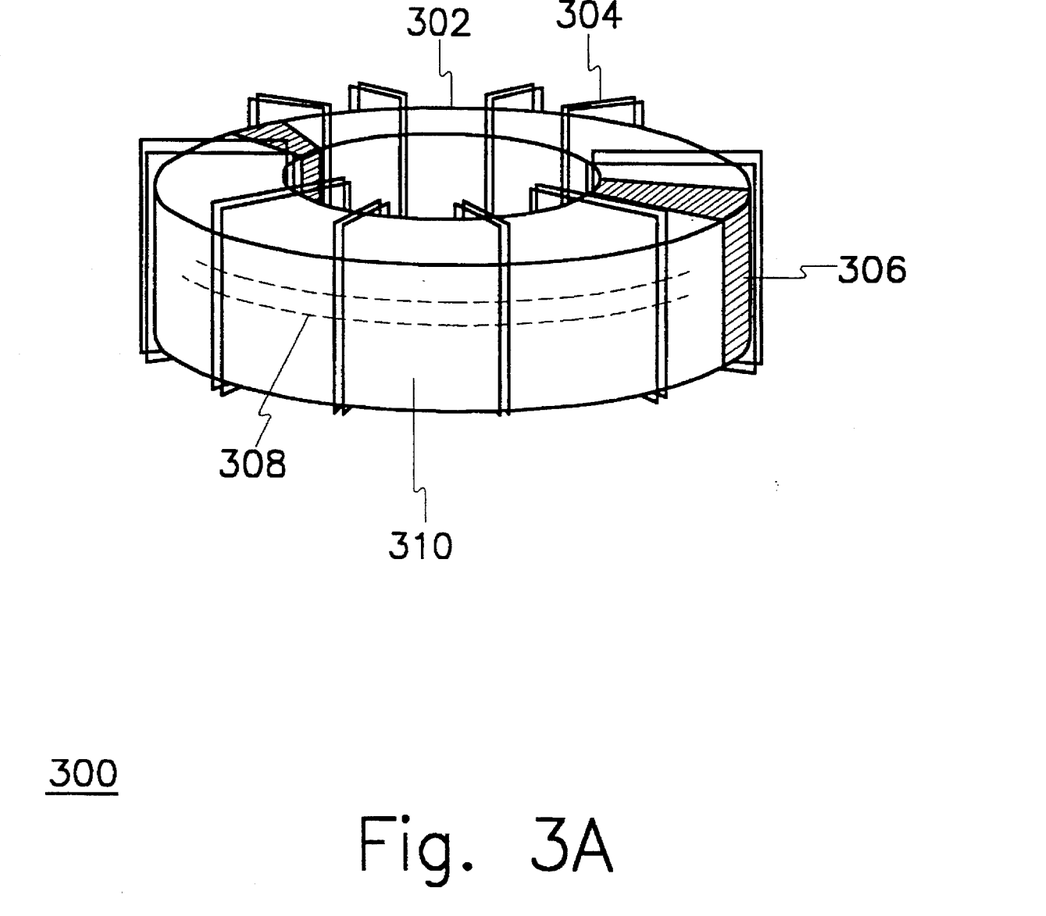
FIGS. 3(A)-3(B) illustrate a toroidal high-density plasma-processing tool with a circular configuration.
Figure 3B:
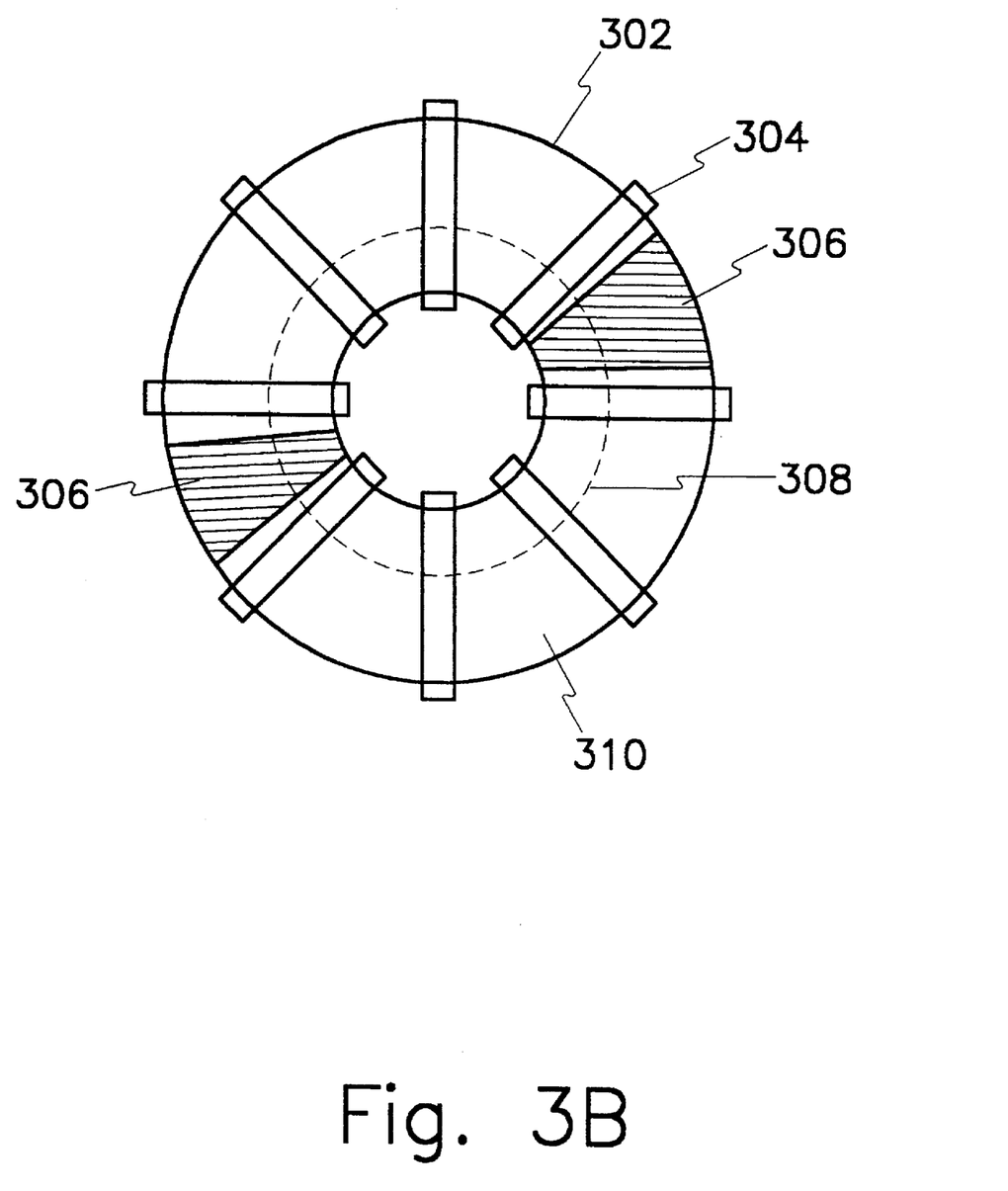

A toroidal high-density plasma-processing tool is shown from the side perspective in FIG. 3(A) and top perspective in FIG. 3(B). Tool 300 includes a plasma processing chamber 302 mounted within a plurality of toroidal field coils 304 and containing a plurality of plasma source regions 306.

Toroidal field coils 304 produce a strong steady-state toroidal magnetic field within the chamber 302. The magnetic field is represented by magnetic field lines 308. Toroidal magnetic fields are known in the art for their minimum magnetic flux leakage (external field). The magnetic field lines 308 of the toroidal magnetic field are parallel to each other and continual, i.e. they close upon themselves.

The plasma is generated from a gas which is introduced into the plasma chamber 302. There, the gas is processed and converted into a plasma 310. The plasma then flows through the plasma processing chamber 302 under the influence of the toroidal magnetic field.

Figure 4A:
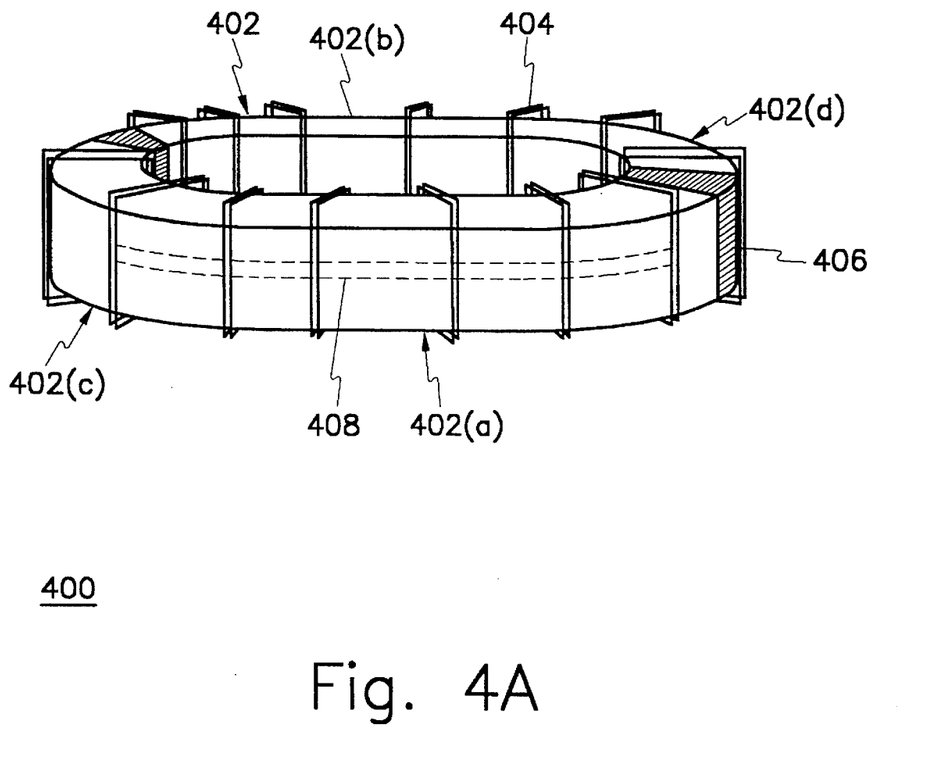
FIGS. 4(A)-4(B) illustrate a toroidal high-density plasma processing tool with a race track configuration.
Figure 4B:
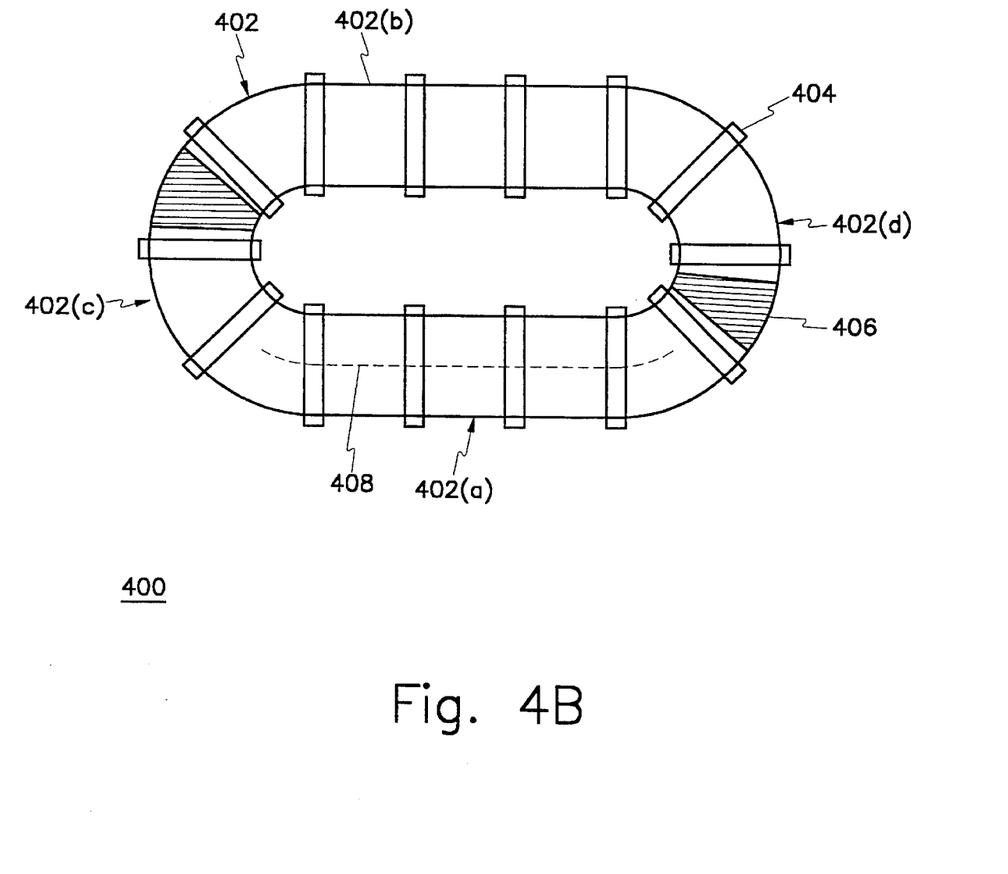

Another embodiment of the present invention is illustrated in FIGS. 4(A) and 4(B). The shape of the plasma processing tool 400 defines a racetrack configuration. The racetrack configuration has opposing and parallel straight sections 402(a) and 402(b) connected by opposed semicircular end sections 402(c) and 402(d). Plasma processing tool 400 comprises plasma processing chamber 402 mounted within toroidal field coils 404 and containing plasma source regions 406. An advantage of the racetrack configuration is that the magnetic field lines 408 do not suffer from magnetic curvature effects in the straight track sections of the chamber. Another advantage of the straight sections of chamber 402 is that they facilitate the mounting of the substrates parallel to the magnetic field lines 408.

Figure 5:
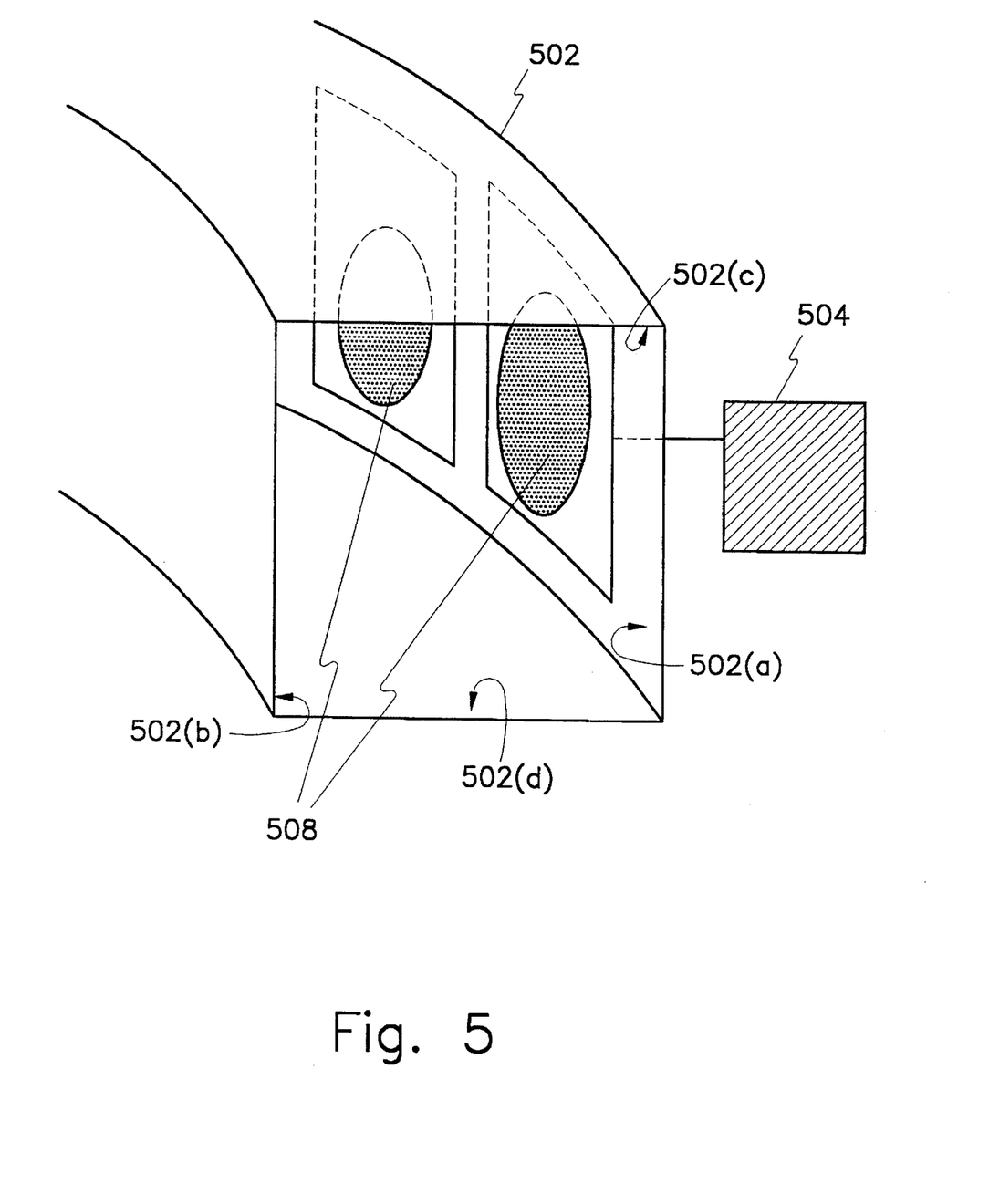
FIG. 5 is a cross-sectional diagram of a high-density plasma-processing tool illustrating wafer installation.

FIG. 5 is a cross-sectional diagram of plasma processing chamber 502. Multiple substrates 508 are installed on the outside walls 502(a) of chamber 502. However, substrates 508 may be installed on any side of the four inside walls (outer side 502(a), inner side 502(b), top side 502(c) or bottom side 502(d). As the plasma travels through processing chamber 502, it interacts with the substrates 508 mounted on the chamber walls 502(a–d). In order to control the degree of exposure of the substrates 508 to the plasma, the present invention is implemented with substrate biasing methods which are known in the art. In FIG. 5, bias source 504 may apply a DC and/or RF voltage to the substrates to control the ion bombardment energies on the devices 508. In the preferred embodiment, the power control of the toroidal solenoids and the power source for the bias source are separate. This allows for the most control of the plasma parameters.

Figure 6A:
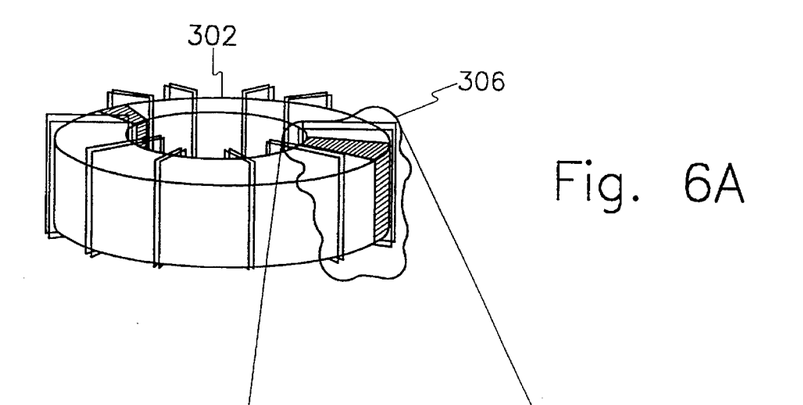
FIGS. 6(A)-6(D) illustrate examples of plasma sources which may be used with the high-density plasma-tool.
Figure 6B:
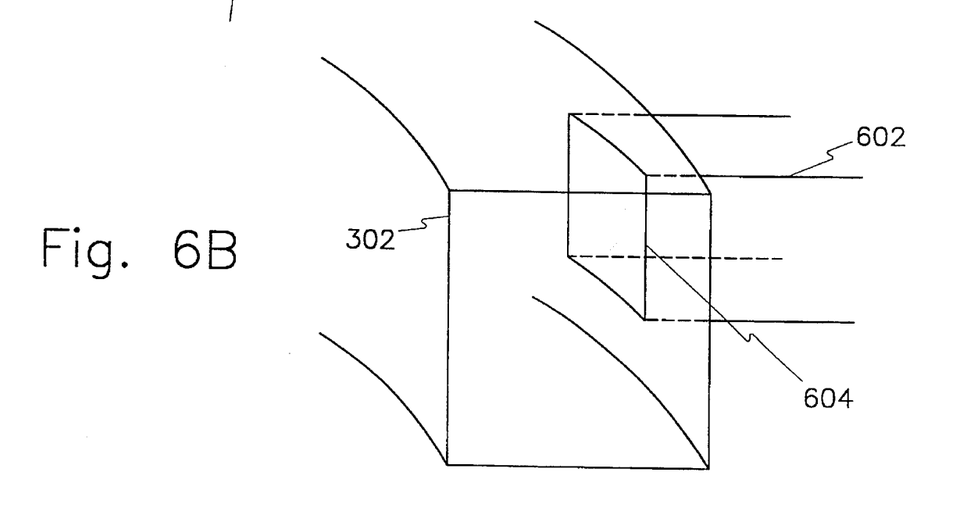
Figure 6C:
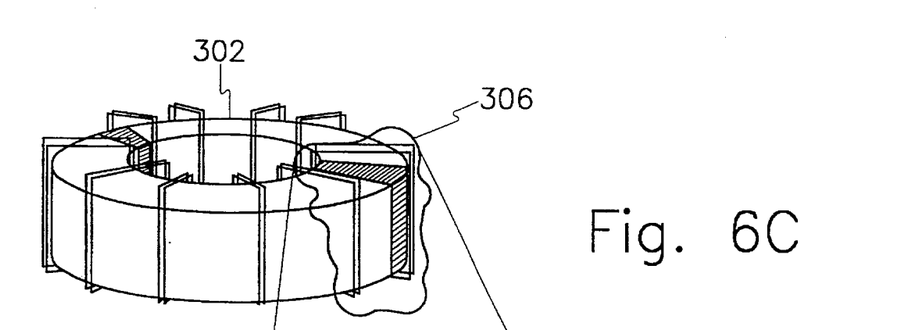
Figure 6D:
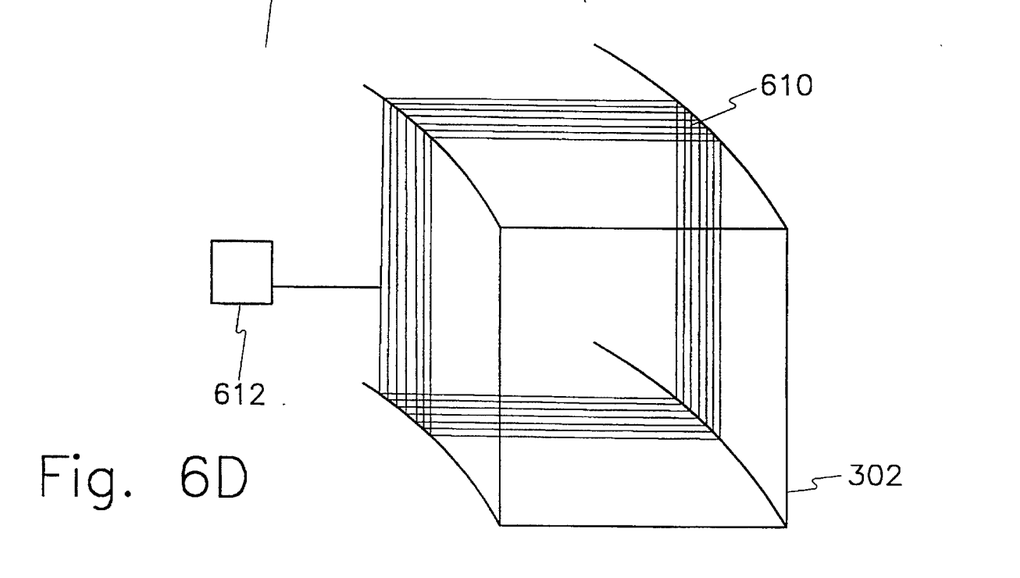

Plasma source regions 306 and 406 can be any of the plasma source regions known in the art. The specific type and number of plasma source regions chosen will depend upon the plasma parameters required for the specific process. An illustration of an ECR source region implemented in the present invention is given in FIGS. 6A and 6B. Implementation of the ECR source region in the present invention may be any of those described in Suzuki, et al., "Journal of the Electromechanical Society" 126, 1024 (1979). In FIGS. 6A and 6B, microwaves are launched from wave guide 602, which is separated from the plasma chamber 302 by quartz window 604. Plasma discharge is generated in the resonant regions of the toroidal magnetic field. The exact coupling between the microwaves and the plasma will depend upon the specific configuration of the antenna and wave guide used. The number of ECR source regions used will depend upon the space available in the chamber and the density of the plasma desired. FIGS. 6C and 6D illustrates the preferred embodiment utilizing a radio frequency induction (RFI) source region which is known in the art. Inductive coils 610 are mounted around plasma chamber 302. The RF source of electrical power 612 supplies the RF signals necessary to produce the plasma discharge in the toroid magnetic field.

The cooling system for the toroidal field coils, the gas feeders, and vacuum pump ports which are required to support the high vacuum in the plasma processing tool are known in the art and are not illustrated in FIGS. 3 and 4. However, the ports and feeders are to be placed in such a way as to maximize the uniformity of the plasma in the toroidal direction. For example, the vacuum pump ports should be placed symmetrically around the plasma processing chamber to maintain a steady state vacuum effect throughout the chamber rather than one larger signal port in a single location.

Figure 7A:
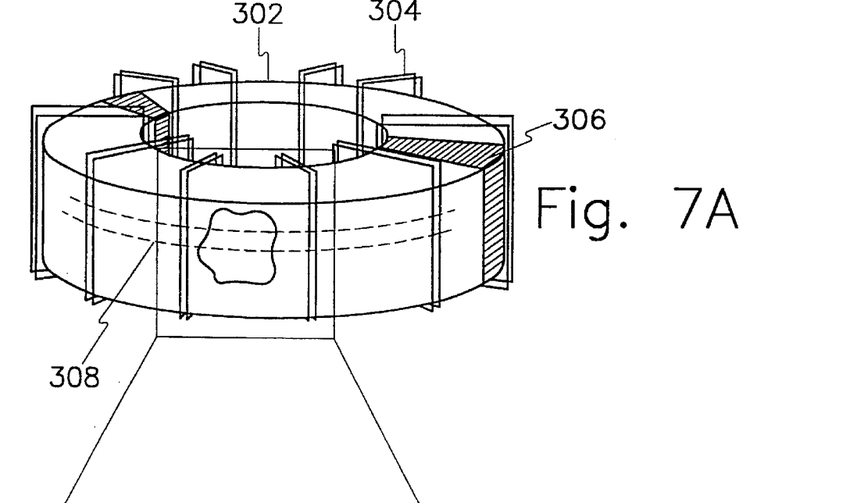
FIGS. 7A-7B is an illustration of the path the plasma particles travel around the toroid along the magnetic field lines.
Figure 7B:
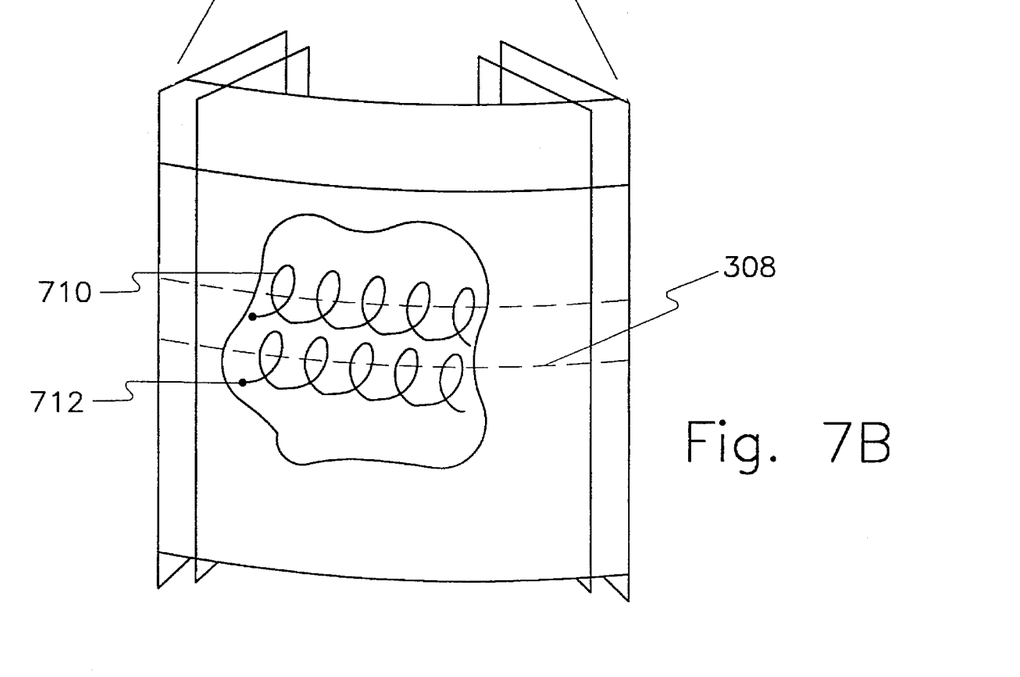

The process of using the plasma processing tool for producing anisotropic etching is now discussed, referring to FIGS. 7A and 7B.

A chosen gas is introduced into the plasma source region(s) 306 where it is processed to form a plasma discharge containing plasma electrons, plasma ions, and radicals. Under the influence of a toroidal magnetic field generated by solenoids 304, the plasma discharge travels in the plasma chamber 302 in the toroidal direction. The plasma electrons have a higher diffusion coefficient than the plasma ions. This causes the electrons to diffuse to the walls of the plasma chamber 302 at a faster rate than the ions. In order to prevent the electrons from leaving the plasma, an electric charge separation naturally occurs at the boundary between the plasma and the processing chamber wall. This charge separation discourages the electrons from diffusing and encourages the ions to diffuse to the processing chamber wall. This mechanism is known as ambipolar diffusion.

When exposed to a magnetic field, electrons and ions travel in a periodic gyro orbit. The strength of the toroidal magnetic field is such that the plasma electrons 712 are magnetized and the plasma ions are not. This will be achieved with magnetic field of approximately 500 to 1 KG. The magnetized electrons 712 travel in orbits which center around the magnetic field lines 308. This results in the helical orbit 710 as shown. The ions are unmagnetized and have orbits which are substantially larger than those of the electrons and the toroid itself. As a result, the ion loss is limited by the ambipolar diffusion.

Due to the small gyro radii of the electrons, the electrons experience a minimal amount of cross field diffusion from one magnetic line to the other. Since the magnetic field lines are continuous and close only with themselves and not with the chamber walls, electron loss occurs only through cross-field diffusion. This magnetic confinement and reduced diffusion results in less electrons leaving the plasma.

The confinement of the electrons to the toroidal magnetic field lines results in electron life-times substantially greater than that presently found in the art. These greater life times result in a high density plasma. The higher the density of the plasma, the more ions which are available for etching or deposition. In addition, the greater number of ions, the more control that can be exhibited on the ion bombardment by implementation of the biasing means 504 of FIG. 5.

The size and number of toroidal field coils 304 and the distance between adjacent coils is estimated by the required magnitude of the magnetic field, amount of field rippling allowable int he toroidal direction, accessibility to the chamber for mounting wafers, cooling requirements, etc.

The electron life-time for the preferred embodiment of the present invention is now estimated. Electron life-time is the amount of time the electron is confined in the plasma. The example high-density plasma-processing tool has a circular configuration as shown in FIGS. 3 and 3B, with a radius of 0.5 m and a circular cross-section with a radius of 10 cm. Using Argon discharge plasma in the source regions, the high density chamber in this example is maintained at such temperature and pressure to yield the parameters given below in Table 1. These parameters are common in traditional plasma processing tools in the art.

TABLE 1

| | |
|---|---|
| Atomic Mass of Argon | $Z = 40$ |
| Electron-Neutral Collision Cross Section for Argon | $\sigma_{en} = 5 \times 10^{-16}$ cm$^2$ |
| Ion-Neutral Collision | $\sigma_{in} = 5 \times 10^{-15}$ cm$^2$ |

TABLE 1-continued

| | |
|---|---|
| Cross Section for Argon | |
| Electron Temperature | $T_e = 10$ eV |
| Ion Temperature | $T_i = 1$ eV |
| Neutral Gas Pressure | $p_g = 1$ mTorr |
| Neutral Number Density | $n_g = 2.7 \times 10^{13}$ cm$^{-3}$ |
| Electron Thermal Velocity | $v_{e,th} = 7.5 \times 10^9 \frac{cm}{sec}$ |
| Ion Thermal Velocity | $v_{i,th} = 6.4 \times 10^6 \frac{cm}{sec}$ |

See S. M. Sze, *Physics of Semiconductor Devices* (2 ed., John Wiley & Sons 1981) for a more detailed development of the relationships used below.

The electron collision frequency and ion collision frequency are therefore given by $$v_e = n_g \sigma_{en} v_{e,th} = 1.8 \times 10^6 \text{ sec}^{-1}$$

$$v_i = n_g \sigma_{in} v_{i,th} = 2.1 \times 10^4 \text{ sec}^{-1}$$

The electron mean free path and ion mean free path are $$\lambda_e = \frac{1}{n_g \sigma_{en}} = 74 \text{ cm}$$

$$\lambda_i = \frac{1}{n_g \sigma_{in}} = 7.4 \text{ cm}$$

The electron mobility and ion mobility are:

$$\mu_e = \frac{q_e}{m_e v_e} = 9.8 \times 10^4 \frac{m^2}{V-s}$$

$$\mu_i = \frac{q_i}{m_i v_i} = 1.1 \times 10^2 \frac{m^2}{V-s}$$

where
q=charge of the particle in Coulombs
m=mass of the particle in Kg
v=collision frequency in sec$^{-1}$ In the preferred embodiment, with toroidal magnetic field of 1KG, this yields a gyro-radius for electrons of $\rho_e = 0.075$ mm and ions of $\rho_i = 0.65$ cm.

The number of times per second the plasma electrons travel one complete gyro (periodic) orbit is given by the electron cyclotron frequency, $\omega_{ce} = 1.8 \times 10^{10}$ sec$^{-1}$. The ion cyclotron frequency $\omega_i = 2.4 \times 10^5$ sec$^{-1}$. This difference in frequency is due to the size of the orbits that the electrons travel as compared to the ions.

Electron and ion collision mean times are the amount of time between collisions. They are simply given by the inverse of the collision frequency, or $\tau_e v_e^{-1}$ and $\tau_i = v_i^{-1}$ Given this, the number of times an electron or ion travels a complete orbit before colliding is given by $$\omega_{ce} \tau_e = 1.0 \times 10^4$$

and $$\omega_{ci} \tau_i = 11$$

Since magnetic field lines 308 are closed in the toroidal direction, the electron loss due to parallel diffusion along the magnetic field lines and losses due to other loss mechanism such as interaction with the plasma chamber walls are negligible. Therefore, the cross-field diffusion is ambipolar and its diffusion coefficient is given by $$D_{\tau a} = \frac{(\mu_i D_{i\theta} + \mu_e D_{\tau i})}{(\mu_i + \mu_e)} \approx D_{\tau i} = 0.90 \frac{m^2}{s}$$

where the electron and ion diffusion coefficients are given by the Einstein relationship:

$$D_{\tau e} = \frac{\left(\frac{k_B T_e}{m_e v_e}\right)}{(1 + \omega_{ce}^2 \tau_e^2)} = 1.0 \times 10^{-2} \frac{m^2}{s}$$

$$D_{\tau i} = \frac{\left(\frac{K_B T_i}{m_i v_i}\right)}{(1 + \omega_{ci}^2 \tau_i^2)} = 0.90 \frac{m^2}{s}$$

where
$k_B$=Boltzman constant
$T_e$=electron temperature
$T_i$=ion temperature

The cross-field diffusion velocities of electrons and ions due to the ambipolar field are given by $$v_{1e} v_{1i} = D_{1a}/r_n$$

where $r_n$=Density gradient scale length≈0.1 m (the radius of the plasma chamber cross-section; the distance from the center of the chamber to the chamber wall).

The electron confinement time $r_e^{(c)}$ is now calculated based on the cross-field diffusion velocities. The electrons are expected to stay in the plasma during the time span given by $$\tau_e^{(c)} = \frac{r_n}{v\tau_e} = 11 \; msec$$

During this time span, the distance the electrons 712 travel along magnetic field line 308 is given by $$L = v_i \tau_e^{(c)} = \frac{v_{e,th}}{\sqrt{3}} \tau_e^{(c)} = 8.3 \times 10^3 m$$

Given the radius measurements of the preferred embodiment, the electrons travel approximately $2.6 \times 10^3$ turns around toroid 302 before they diffuse.

While the invention has been particularly shown and described with reference to a preferred embodiment thereof, it will be understood by those skilled in the art that various changes in form and details may be made therein without departing from the spirit and scope of the invention.

Having thus described our invention, what we claim as new and desire to secure by Letters Patent is:

1. A high density plasma processing tool comprising:
   a plasma processing chamber having walls and an interior flow path defined by said walls of said plasma processing chamber, said plasma processing chamber adapted to contain at least one substrate, said plasma processing chamber closing upon itself;
   magnetic field means for producing a toroidal magnetic field in said processing chamber, said magnetic field means including a plurality of solenoid coils mounted around said processing chamber, said toroidal magnetic field comprising magnetic field lines confined to said interior flow path;
   pump means, connected to said plasma processing chamber, for evacuating said plasma processing chamber; and
   source means, coupled to said plasma processing chamber, for producing a plasma discharge contained within said plasma processing chamber, including,
      a source region within said plasma processing chamber, said source region having an inlet connected to a source of continuously flowable gas, and
      radio frequency induction means, adjacent to said source region, for converting said continuously flowable gas to said plasma discharge,
   wherein said walls of said plasma processing chamber have a cross-sectional shape such that plasma stability and plasma uniformity are maximized and wherein said walls of said plasma processing chamber provide a flat surface, said at least one substrate placed thereon,
   wherein said plasma processing chamber has a pair of parallel straight sections and a pair of curved sections, each of said curved sections coupled to opposing ends of said parallel straight sections, said pair of parallel straight sections and said pair of curved sections together forming a racetrack shape, said racetrack shape minimizing the diffusion of electrons from said plasma,
   wherein said at least one substrate is positioned along said walls of said plasma processing chamber along said pair of parallel straight sections, and
   wherein said cross-sectional area and said racetrack shape work in conjunction with each other to facilitate the placement of said at least one substrate in a position parallel to said interior flow path of said plasma processing chamber.

2. The high density plasma processing tool of claim 1, wherein said plasma discharge comprises entities which induce anisotropic removal of material from said at least one substrate.

3. The high density plasma processing tool of claim 1, wherein said plasma comprises entities which induce deposition on said at least one substrate.

4. The high density plasma processing tool of claim 1, further comprising:
   bias electrical power source means for applying a radio frequency bias voltage to said at least one substrate such that the ions of said plasma discharge have sufficient energy for etching said at least one substrate.

5. The high density plasma processing tool of claim 1, wherein said cross-sectional shape of said walls of said plasma processing chamber is rectangular.

6. The high density plasma processing tool of claim 1, further comprising:
   bias electrical power source means for applying a direct current bias voltage to said at least one substrate such that the ions of said plasma have sufficient energy for etching said at least one substrate.

7. The high density plasma processing tool of claim 1, wherein said processing chamber is adapted to contain a plurality of substrates, said substrates being parallel to said interior flow path.

8. The high density plasma processing tool of claim 1, wherein said source means comprises a plurality of source regions within said processing chamber, said source regions having an inlet connected to a source of continuously flowable gas.

9. A method for fabricating micorelectronic devices in a high density plasma processing tool comprising a self-enclosed processing chamber, comprising the steps of:
   maintaining the processing chamber in a vacuum condition;

introducing a gas into a plurality of plasma source regions in the processing chamber;

converting said gas to a plasma discharge; and influencing said plasma discharge with a toroidal magnetic field.

10. A high density plasma processing tool comprising:

a plasma processing chamber having walls and an interior flow path defined by said walls of said plasma processing chamber, said plasma processing chamber adapted to contain at least one substrate, said plasma processing chamber closing upon itself;

magnetic field means for producing a toroidal magnetic field in said processing chamber, said magnetic field means including a plurality of solenoid coils mounted around said processing chamber, said toroidal magnetic field comprising magnetic field lines confined to said interior flow path;

pump means, connected to said plasma processing chamber, for evacuating said plasma processing chamber; and source means, coupled to said plasma processing chamber, for producing a plasma discharge contained within said plasma processing chamber, including, a source region within said plasma processing chamber, said source region having an inlet connected to a source of continuously flowable gas, wherein said walls of said plasma processing chamber have a cross-sectional shape such that plasma stability and plasma uniformity are maximized and wherein said walls of said plasma processing chamber provide a flat surface, said at least one substrate placed thereon, wherein said plasma processing chamber has a pair of parallel straight sections and a pair of curved sections, each of said curved sections coupled to opposing ends of said parallel straight sections, said pair of parallel straight sections and said pair of curved sections together forming a racetrack shape, said racetrack shape minimizing the diffusion of electrons from said plasma, wherein said at least one substrate is positioned along said walls of said plasma processing chamber along said pair of parallel straight sections, and wherein said cross-sectional area and said racetrack shape work in conjunction with each other to facilitate the placement of said at least one substrate in a position parallel to said interior flow path of said plasma processing chamber.

11. The high density plasma processing tool of claim 10, wherein said source means further comprises:

electron cyclotron resonance means for converting said continuously flowable gas to said plasma discharge.

12. The high density plasma processing tool of claim 10, wherein said plasma discharge comprises entities which induce anisotropic removal of material from said at least one substrate.

13. The high density plasma processing tool of claim 10, wherein said plasma discharge comprises entities which induce deposition on said at least one substrate.

14. The high density processing tool of claim 10, wherein said cross-sectional shape of said walls of said plasma processing chamber is rectangular.

15. A high density plasma processing tool comprising:

a plasma processing chamber having walls and an interior flow path defined by said walls of said plasma processing chamber, said plasma processing chamber adapted to contain at least one substrate, said plasma processing chamber closing upon itself;

magnetic field means for producing a toroidal magnetic field in said processing chamber, said magnetic field means including a plurality of solenoid coils mounted around said processing chamber, said toroidal magnetic field comprising magnetic field lines confined to said interior flow path;

pump means, connected to said plasma processing chamber, for evacuating said plasma processing chamber; and source means, coupled to said plasma processing chamber, for producing a plasma discharge contained within said plasma processing chamber, including, a source region within said plasma processing chamber, said source region having an inlet connected to a source of continuously flowable gas, bias electrical power source means for applying a radio frequency and/or direct current bias voltage to said at least one substrate such that the ions of said plasma have sufficient energy for etching said at least one substrate, wherein said walls of said plasma processing chamber have a cross-sectional shape such that plasma stability and plasma uniformity are maximized and wherein said walls of said plasma processing chamber provide a flat surface, said at least one substrate placed thereon, wherein said plasma processing chamber has a pair of parallel straight sections and a pair of curved sections, each of said curved sections coupled to opposing ends of said parallel straight sections, said pair of parallel straight sections and said pair of curved sections together forming a racetrack shape, said racetrack shape minimizing the diffusion of electrons from said plasma, wherein said at least one substrate is positioned along said walls of said plasma processing chamber along said pair of parallel straight sections, and wherein said cross-sectional area and said racetrack shape work in conjunction with each other to facilitate the placement of said at least one substrate in a position parallel to said interior flow path of said plasma processing chamber.

16. The high density plasma processing tool of claim 15, wherein said source means further comprises a radio frequency induction means for converting said continuously flowable gas to said plasma discharge.

17. The high density plasma processing tool of claim 15, wherein said source means further comprises an electron cyclotron resonance means for converting said continuously flowable gas to said plasma discharge.

18. The high density plasma processing tool of claim 15, wherein said plasma discharge comprises entities which induce anisotropic removal of material from said at least one substrate.

19. The high density plasma processing tool of claim 15, wherein said plasma discharge comprises entities which induced deposition on said at least one substrate.

20. The high density plasma processing tool of claim 15, wherein said cross-sectional shape of said walls of said plasma processing chamber is rectangular.

* * * * *